United States Patent
Parris et al.

(10) Patent No.: US 6,608,797 B1
(45) Date of Patent: Aug. 19, 2003

(54) AUTOMATIC DELAY TECHNIQUE FOR EARLY READ AND WRITE OPERATIONS IN SYNCHRONOUS DYNAMIC RANDOM ACCESS MEMORIES

(75) Inventors: Michael C. Parris, Colorado Springs, CO (US); Kim C. Hardee, Colorado Springs, CO (US); Oscar Frederick Jones, Jr., Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 0 days.

(21) Appl. No.: 10/125,756

(22) Filed: Apr. 18, 2002

(51) Int. Cl.[7] .................................................. G11C 8/00
(52) U.S. Cl. ................... 365/233; 365/194; 365/230.06
(58) Field of Search ................................. 365/233, 194, 365/149, 230.06

(56) References Cited

U.S. PATENT DOCUMENTS 6,163,498 A * 12/2000 Moon ..................... 365/230.06

* cited by examiner

Primary Examiner—Tan T. Nguyen
(74) Attorney, Agent, or Firm—William J. Kubida; Peter J. Meza; Hogan & Hartson LLP

(57) ABSTRACT

An automatic delay technique for early "read" and "write" memory access operations in synchronous dynamic random access memory ("SDRAM") devices and those integrated circuit devices employing embedded SDRAM arrays. A circuit and method is provided which controls the internal column select ("Yi") and data signals such that the column address strobe ("/CAS") signal is allowed to go "active" in advance of that otherwise possible in conjunction with conventional SDRAM arrays. In an exemplary embodiment, the column select signals ("read" or "write") are delayed until either the corresponding, pre-decoded column address signal or the respective column clock signal is valid, whichever occurs later.

16 Claims, 5 Drawing Sheets

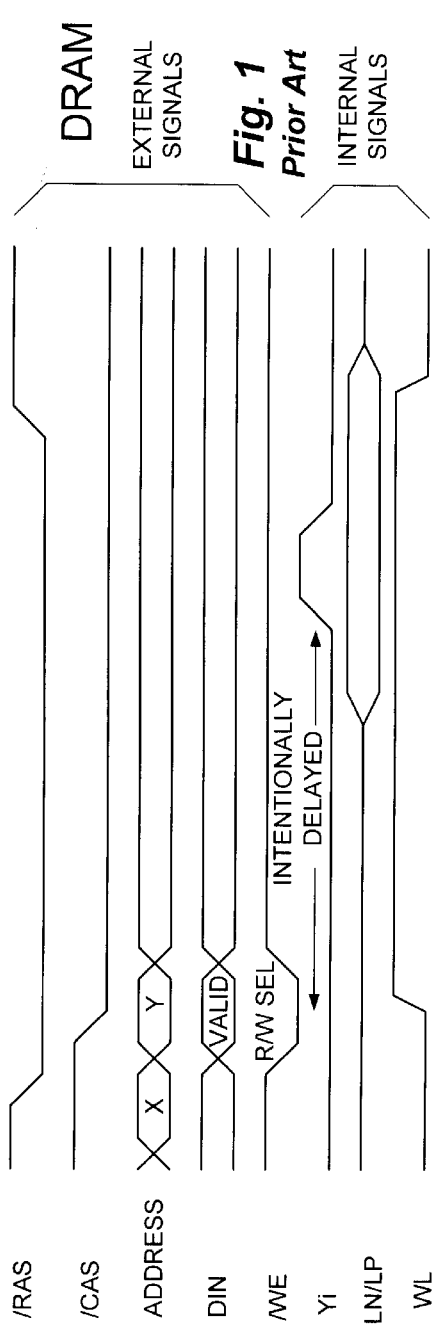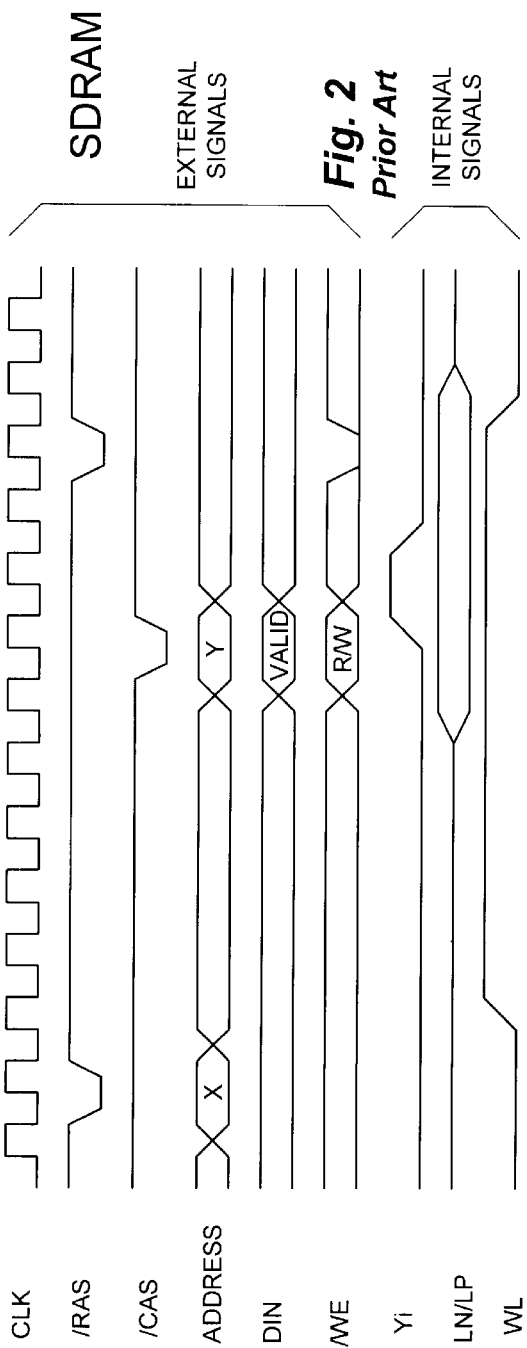

AUTOMATIC DELAY TECHNIQUE FOR EARLY READ AND WRITE OPERATIONS IN SYNCHRONOUS DYNAMIC RANDOM ACCESS MEMORIES

BACKGROUND OF THE INVENTION

The present invention relates, in general, to the field of integrated circuit ("IC") memory devices and those devices incorporating embedded memory. More particularly, the present invention relates to an automatic delay technique for early "read" and "write" memory access operations in synchronous dynamic random access memory ("SDRAM") devices and those ICs employing embedded SDRAM arrays.

"Read" and "write" commands can only be given to dynamic random access memory ("DRAM") devices after the row address has been decoded, the appropriate word line ("WL") selected, the proper bit line ("BL") signal amplified and the applicable sense amplifier ("SA") latched. The period of time between the bank select and read/write command assertion is commonly referred to as $t_{RCD}$, or the row address strobe ("/RAS") to column address strobe ("/CAS") delay.

If a DRAM "read" or "write" command is allowed to occur too early, data can be corrupted by what is generally termed a sense amplifier "disturb". This "disturb" can cause an operational failure through the premature "read" of a selected column address, with a resultant failure in correctly reading that address. Alternatively, if a "write" is allowed to occur too early, adjacent columns can fail due to the act of writing to a particular column before the sense amplifiers have had time to latch their data as a consequence of capacitive coupling to those adjacent columns.

In this regard, circuits have been developed for asynchronous (or non-clocked) DRAMs such as extended data out ("EDO") and fast page mode ("FPM") DRAMs wherein the column address strobe signal may be asserted early and the read/write and address information latched on the falling edge of the /CAS signal. Internally, a clock or other timer is used to "hold off" the column select and data information until the sense amplifier has been latched. This effectively prevents the previously mentioned "disturb" condition.

On the other hand, in synchronous (or clocked) DRAMs, double data rate ("DDR") SDRAMs and most embedded DRAMs, no analogous technique has been employed and an early /CAS has not been permitted with the external column address and data information having to equal the device's internal set-up requirements in order to prevent any array or sense amplifier "disturbs". Due to the nature of a clocked DRAM (or SDRAM), commands can be given only once per clock period. This quantizing effect raises the importance of the present invention since there may be cases with prior art SDRAMs where the /RAS to /CAS delay ($t_{RCD}$) specification is just barely missed and the user is force to wait for an entire clock period to start a "read" or "write" operation.

SUMMARY OF THE INVENTION

In accordance with the technique of the present invention disclosed herein, a circuit and method which controls the internal column select ("Yi") and data signals is provided in conjunction with a synchronous DRAM array such that the /CAS signal is allowed to go "active" in advance of that otherwise possible in conjunction with conventional SDRAM devices and other ICs having embedded SDRAM arrays.

In an exemplary embodiment disclosed herein, a system for implementing the technique of the present invention functions to delay the column select signal "Yi" (either the "read" column select signal "$Y_{Ri}$" or the "write" column select signal "$Y_{Wi}$") until either of the pre-decoded column address signals "CA210" (either the corresponding pre-decoded "read" column address signal "CA210R" or the pre-decoded "write" column address signal "CA210W") or the column clock signal "PHIYB" (either the corresponding column clock "read" signal "PHIYBR" or the column clock "write" signal "PHIYBW") is valid, whichever occurs later. Functionally, the PHIYB signal is delayed by the clock "CLK" or select "SEL" (either the "read" select signal "RSEL" or the "write" select signal "WSEL"), whichever is later. For the "write" circuitry disclosed herein, the array select "write" signal "ASELW" output from the array select circuit is used, which signal goes "valid" after the sensing begins. For the "read" circuitry disclosed herein, the array signal "read" signal "ASELR" is used, which signal goes "valid" a fixed delay after the sensing begins. This allows the sense amplifier latch nodes to separate before $Y_{Ri}$ goes "valid" to ensure a fast read access time "$t_{AC}$".

Particularly disclosed herein is a method for effectuating an access operation in a synchronous dynamic random access memory array arranged in rows and columns. The method comprises the steps of: awaiting an indication of a valid state of a pre-decoded column address signal for the access operation; also awaiting an indication of a valid state of a column clock signal and delaying a column select signal for the access operation until the later of a valid state of the pre-decoded column address signal or the column clock signal. In a more detailed implementation, the method further comprises the steps of: awaiting an indication of a valid state of an array select signal for the access operation; further awaiting assertion of a clock signal and delaying the indication of a valid state of the column clock signal until the later of a valid state of the array select signal or the clock signal.

When the access operation is a "write" operation, the method may further comprise the steps of: detecting a sense amplifier enable signal to the memory array and indicating the valid state of the array select signal upon detection of the sense amplifier enable signal. When the access operation is a "read" operation, the method may further comprise the steps of: detecting a sense amplifier enable signal to the memory array and indicating the valid state of the array select signal a predetermined time period following detection of the sense amplifier enable signal.

Also disclosed herein is an integrated circuit device including a circuit for controlling a column select signal in a synchronous dynamic random access memory array. The circuit comprises: an array select circuit for receiving a sense amplifier enable signal and providing a first array select signal in response thereto; a first column clock circuit for receiving the first array select signal, a first column address signal and a clock signal with the first column clock circuit providing a first column clock signal in response thereto and a first access operation column decoder circuit for receiving the first column clock signal and a first pre-decoded column address signal and providing a first column select signal in response thereto.

In a more detailed implementation the circuit may comprise: a second column clock circuit for receiving a second array select signal from the array select circuit, a second column address signal and the clock signal with the second column clock circuit providing a second column clock signal in response thereto. A second access operation column decoder circuit is provided for receiving the second column clock signal and a second pre-decoded column address signal and providing a second column select signal in response thereto.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 1 is a simplified timing diagram for a prior art asynchronous, or non-clocked, DRAM device illustrative of the capability for early assertion of the /CAS signal, with the externally supplied addresses ("X" and "Y") and read/write ("R/W") signal being latched on the falling edge of /CAS;

FIG. 2 is a corresponding simplified timing diagram for a prior art SDRAM device illustrative of the timing of the various signals indicated showing the relative delay in the assertion of the /CAS signal prior to being able to latch the addresses and the R/W signal;

DESCRIPTION OF A REPRESENTATIVE EMBODIMENT

With reference now to FIG. 1, a simplified timing diagram for a prior art asynchronous, or non-clocked, DRAM device is shown illustrative of the capability for early assertion of the /CAS signal, (i.e. a relatively short /RAS to /CAS delay, $t_{RCD}$) with the externally supplied addresses ("X" and "Y") and read/write ("R/W") signal being latched on the falling edge of /CAS. As previously described, a DRAM operating in accordance with this prior art timing technique would generally include a clock, or timer, that would function to intentionally hold off the column select (Yi) and data information until the sense amplifier had been latched in order to preclude a possible sense amplifier "disturb".

With reference additionally now to FIG. 2, a corresponding, simplified timing diagram for a prior art SDRAM device is also shown illustrative of the timing of the same signals illustrated in the preceding figure with respect to an internal clock signal. As indicated, an increased delay in the assertion of the /CAS signal (i.e. a longer $t_{RCD}$) is required prior to being able to latch the addresses and the R/W signal; the external column address and the data information has to equal the predetermined, internal SDRAM constraints in order to prevent any memory array or sense amplifier "disturbs". In other words, in such conventional devices, the /CAS signal is constrained from going "active" until the LN/LP signal has gone "valid" and the sense amplifier is latched.

Figure 3:
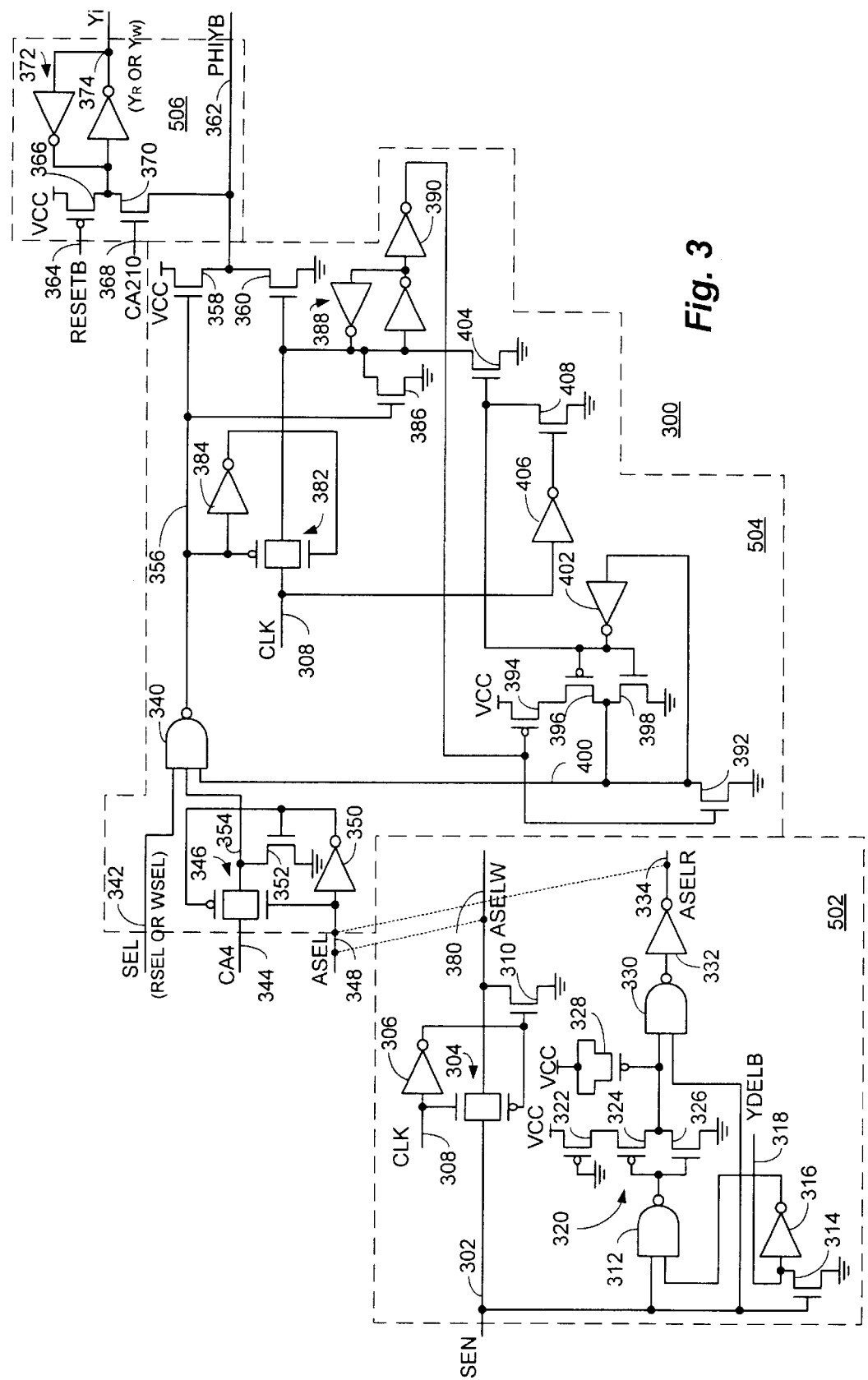
FIG. 3 is a schematic diagram of an auto delay circuit for enabling early read/write accesses in SDRAMs in accordance with one embodiment of the present invention.

With reference additionally to FIG. 3, a schematic diagram of a particular implementation of an auto delay circuit 300 for enabling early read/write accesses in SDRAMs in accordance with one embodiment of the present invention is shown. The various signal inputs and outputs to the circuit 300 are defined as follows:

SEN: Sense amplifier enable; initiates the latch N-channel bar ("LNB") and latch P-channel bar ("LPB") clocks.
ASELW: Array select write; timed off of SEN.
ASELR: Array select read; timed off of SEN.
ASEL: Array select; coupled to either ASELR or ASELW depending upon whether a "read" or "write" column select signal Yi is to be generated.
RSEL: Read select.
WSEL: Write select.
CLK: Clock; Main internal clock signal.
RESETB: Reset bar; self times the Yi pulse width.
CA4: Internal column address signal; CA4W (write), CA4R read).
CA210: Pre-decoded column address; CA210W (write), CA210R (read).
Yi: Column select signals; $Y_{Wi}$ (write) $Y_{Ri}$ (read).
PHIYB: Column clock bar; enables all column decoders; PHIYBW (write), PHIYBR (read).
YDELB: Column select (Y) delay bar; an input to the main "read" amplifier.

The circuit 300, as will be described in more detail with respect to succeeding figures, comprises an array select circuit 502, separate "read" and "write" column clock generator circuits 504 and corresponding "read" and "write" column decoder circuits 506.

The SEN signal on line 302 is input to a complementary metal oxide semiconductor ("CMOS") transmission gate 304 to provide the ASELW signal on line 380. The CLK signal on line 308 is input to the one control terminal of the transmission gate 304 and through an inverter 306 to the opposite control terminal and the gate of N-channel transistor 310, which couples line 380 to circuit ground (reference voltage VSS).

The SEN signal is also supplied as one input to two input NAND gates 312 and 330 as well as the gate of N-channel transistor 314 which couples the input of inverter 316 to circuit ground. The signal YDELB on line 318 is also supplied to the input of inverter 316 and its output is coupled to the other input of NAND gate 312. The output of NAND gate 312 is connected to the input of an inverter 320 comprising series connected P-channel transistors 322, 324 and N-channel transistor 326 coupled between a supply voltage VCC and circuit ground. The gate of transistor 322 is coupled to ground while the common connected gates of transistors 324, 326 define the input of the inverter 320. An additional P-channel transistor 328, having its source and drain terminals coupled to VCC, has its gate terminal coupled to the output of the inverter 320 and the other input of NAND gate 330. The output of NAND gate 330 is inverted through inverter 332 for providing the ASELR signal on line 334.

The SEL signal is applied to one input of three input NAND gate 340 on line 342 while an internal column address signal ("CA4") on line 344 is supplied through transmission gate 346 to a second input on line 354. The ASEL signal on line 348 is coupled to the input of inverter 350 as well as one control terminal of the transmission gate 346. Output from the inverter 350 is coupled to the other input of the transmission gate 346 as well as the gate of N-channel transistor 352 which couples line 354 to circuit ground. In a particular implementation of the present invention the CA4 signal may be utilized to perform a left/right select function for two different pairs of column clock generator circuits 504 wherein a pair of "read" and "write" column clock generator circuits $504_R$ and $504_W$ respectively may be located at each side of a memory sub-array, with the left pair receiving a CA4B signal and the right pair the complementary CA4 signal.

Output of NAND gate 340 on line 356 is supplied to the gate terminal of N-channel transistor 358 which is connected in series with N-channel transistor 360 between VCC and circuit ground. The CLK signal on line 308 is coupled to the input of transmission gate 382 which has one control terminal coupled to line 356 and the other connected thereto through inverter 384. The output of transmission gate 382 is coupled to the gate terminal of transistor 360 as well as to one terminal of N-channel transistors 386 and 404 which have their opposite terminal coupled to circuit ground. The gate terminal of transistor 386 is coupled to line 356 and the output of transmission gate 382 is also coupled to the input of a latch 388 comprising cross-coupled inverters whose output is connected through inverter 390 to the gate terminals of N-channel transistor 392 and P-channel transistor 394.

Transistor 392 couples the third input of NAND gate 340 on line 400 to circuit ground while transistor 394 is connected in series with P-channel transistor 396 and N-channel transistor 398 between VCC and circuit ground. The node intermediate transistors 396 and 398 is coupled to line 400 while the common connected gate terminals of these devices are coupled to the gate of transistor 404. An inverter 402 couples line 400 to the common connected gates of transistors 396, 398. The gate of transistor 404 is coupled to circuit ground through transistor 408 which has its gate terminal coupled to receive the CLK signal on line 308 through inverter 406.

The node intermediate transistors 358, 360 defines line 362 for providing the PHIYB signal. Series connected P-channel transistor 366 and N-channel transistor 370 couple VCC to line 362. The gate terminal of transistor 366 receives the RESETB signal on line 364 while the gate terminal of transistor 368 receives the CA210 signal. The node intermediate transistors 366 and 370 is coupled to the input of a latch 372, comprising cross-coupled inverters, the output of which on line 374 supplies the Yi signal.

Figure 4:
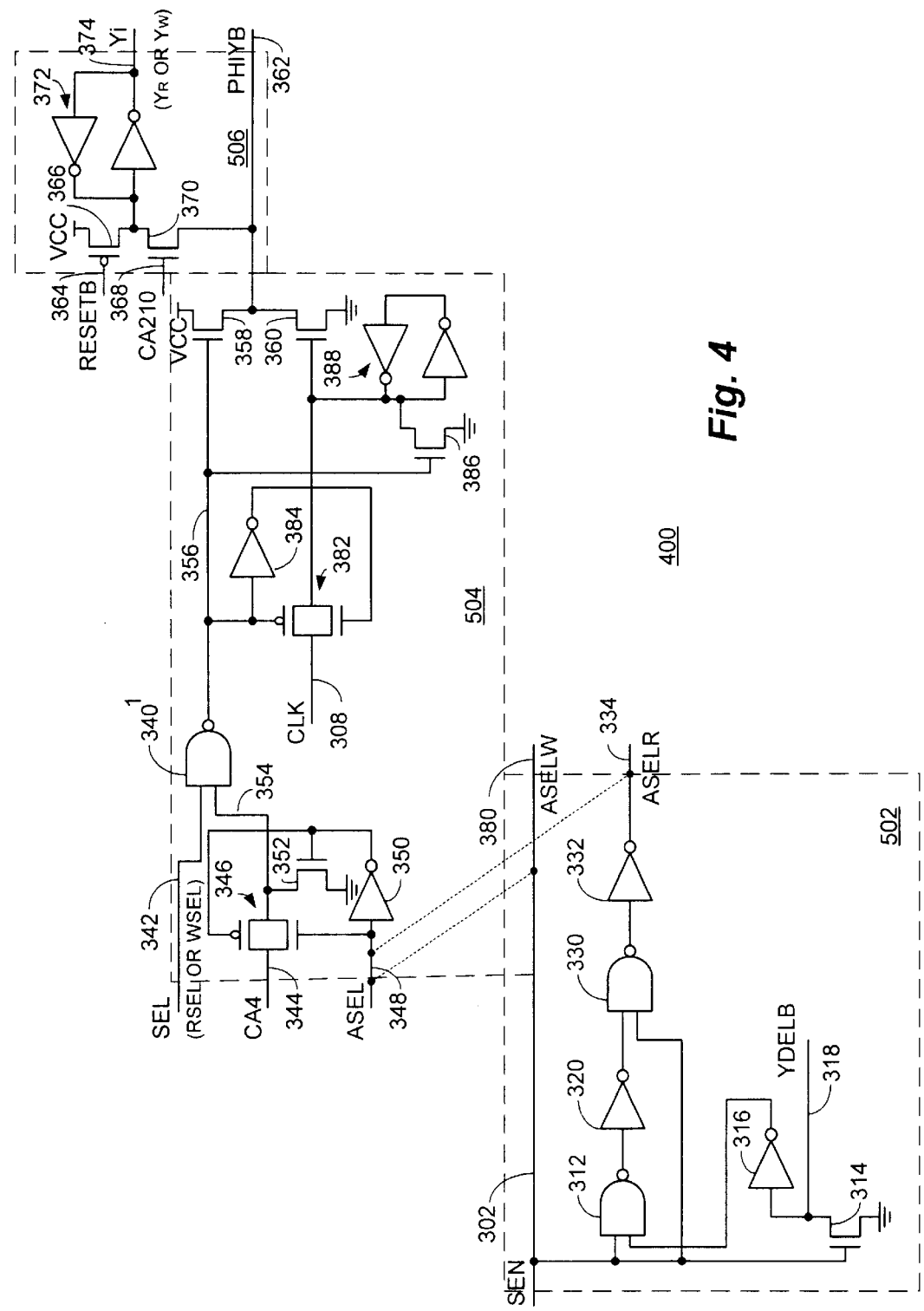
FIG. 4 is an additional schematic diagram of an auto delay circuit comprising an alternative, simplified embodiment for implementing the technique of the present invention.

With reference additionally now to FIG. 4, an additional schematic diagram of an auto delay circuit 400 comprising an alternative, simplified embodiment for implementing the technique of the present invention is shown. In this embodiment, the SEN signal on line 302 is connected directly to line 380 to provide the ASELW signal unlike the embodiment of the preceding figure. The SEN signal is again coupled to one input of the two input NAND gates 312 and 330 as well as the gate of transistor 314. The YDELB signal on line 318 is coupled to circuit ground through transistor 314 as well as connected to the input of inverter 316 which has its output connected to the second input of NAND gate 312. Output of NAND gate 312 is inverted through inverter 320 for connection to the other input of NAND gate 330. The output of NAND gate 330 is inverted through inverter 332 to provide the ASELR signal on line 334.

In this embodiment, the SEL signal applied to one input of a two input NAND gate $340^1$ on line 342 while the CA4 signal is supplied through transmission gate 346 to the second input on line 354. The ASEL signal on line 348 is coupled to the input of inverter 350 as well as one control terminal of the transmission gate 346. Output from the inverter 350 is coupled to the other input of the transmission gate 346 as well as the gate of N-channel transistor 352 which couples line 354 to circuit ground.

Output of NAND gate $340^1$ on line 356 is supplied to the gate terminal of N-channel transistor 358 which is connected in series with N-channel transistor 360 between VCC and circuit ground. The CLK signal on line 308 is coupled to the input of transmission gate 382 which has one control terminal coupled to line 356 and the other connected thereto through inverter 384. The output of transmission gate 382 is coupled to the gate terminal of transistor 360 as well as to one terminal of N-channel transistor 386 which has its opposite terminal coupled to circuit ground. The gate terminal of transistor 386 is coupled to line 356 and the output of transmission gate 382 is also coupled to the input of a latch 388.

As in the embodiment of the preceding figure, the node intermediate transistors 358, 360 defines line 362 for providing the PHIYB signal. Series connected P-channel transistor 366 and N-channel transistor 370 couple VCC to line 362. The gate terminal of transistor 366 receives the RESETB signal on line 364 while the gate terminal of transistor 368 receives the CA210 signal. The node intermediate transistors 366 and 370 is coupled to the input of a latch 372, comprising cross-coupled inverters, the output of which on line 374 supplies the Yi signal.

Figure 5:
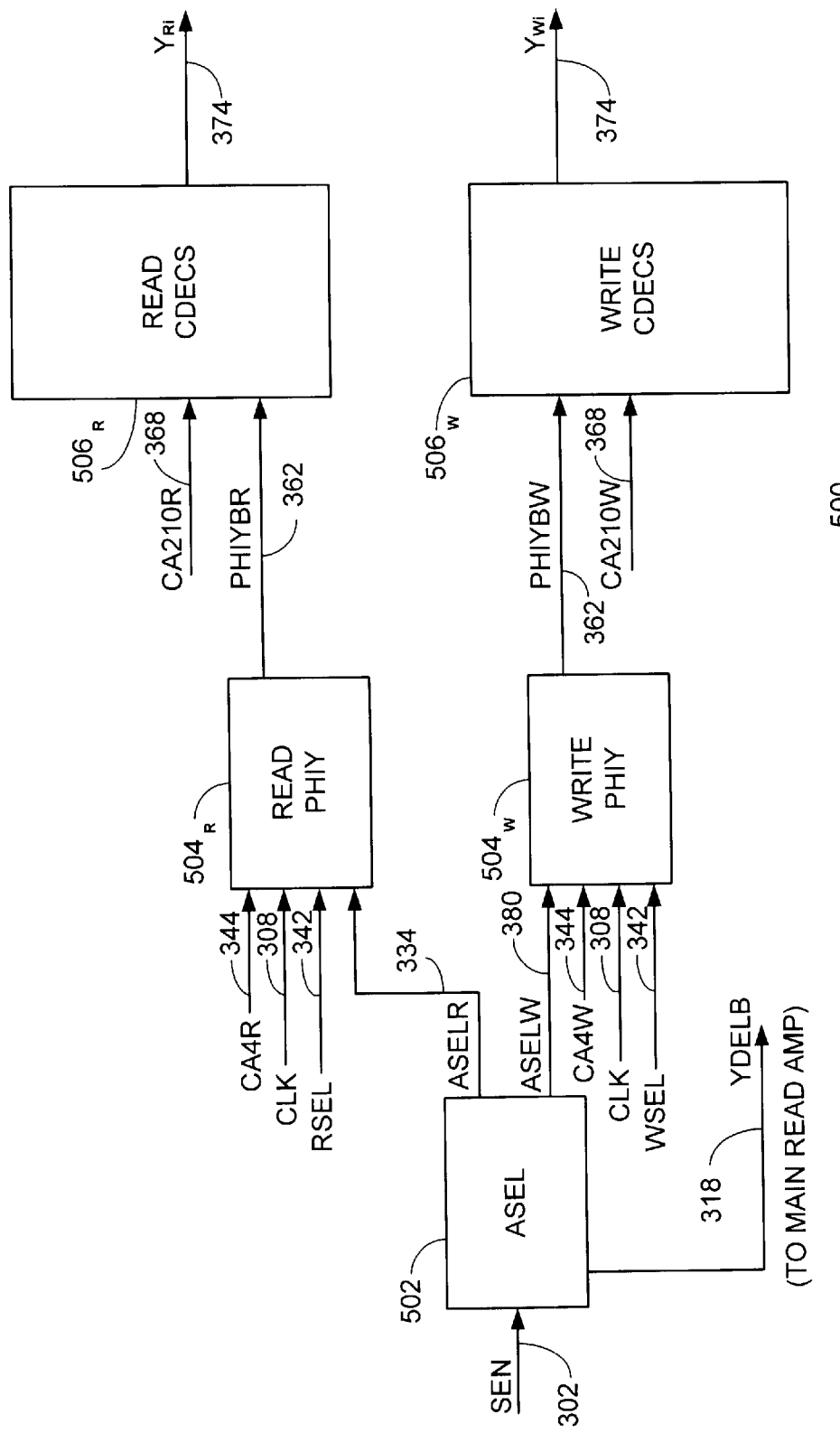
FIG. 5 is a higher level, functional block diagram of a complete system for implementing an auto delay for early read/write accesses in SDRAMs comprising the circuits of either FIGS. 3 or 4.

With reference additionally now to FIG. 5, a complete system 500 for implementing an auto delay for early read/write access in SDRAMs is illustrated in the form of a higher level, functional block diagram comprising the circuits of either of the two preceding figures. Functional blocks, signals and signal lines previously described with respect to FIGS. 3 and 4 are herein like-numbered and the foregoing descriptions thereof shall suffice herefor. As indicated the system 500 utilizes separate "read" and "write" column clock generator circuits $504_R$ and $504_W$ respectively, each coupled to a corresponding "read" and "write" column decoder circuits $506_R$ and $506_W$. The PHIYBR and PHIYBW signals on lines 362 are used for gating, or timing, the corresponding $Y_{Ri}$ or $Y_{Wi}$ signals on lines 374.

In operation, the system 500 functions to delay the signal Yi ($Y_{Ri}$ or $Y_{Wi}$) on line 374 until either of the signals CA210 (CA210R or CA210W) on line 368 or PHIYB on line 362 (PHIYBR or PHIYBW) is valid, whichever is later. Functionally, the PHIYB signal on line 362 is delayed by the CLK signal on line 308 or the SEL signal on line 342 (RSEL or WSEL), whichever is later. For the "write" circuitry, the signal ASELW on line 380 output from the ASEL circuit 502 is used, which signal goes "valid" after the sensing begins. For the "read" circuitry, the signal ASELR on line 334 is used which signal goes valid a fixed delay after the sensing begins. This allows the sense amplifier latch nodes to separate before $Y_{Ri}$ goes "valid" to ensure a fast read access time "$t_{AC}$".

Figure 6:
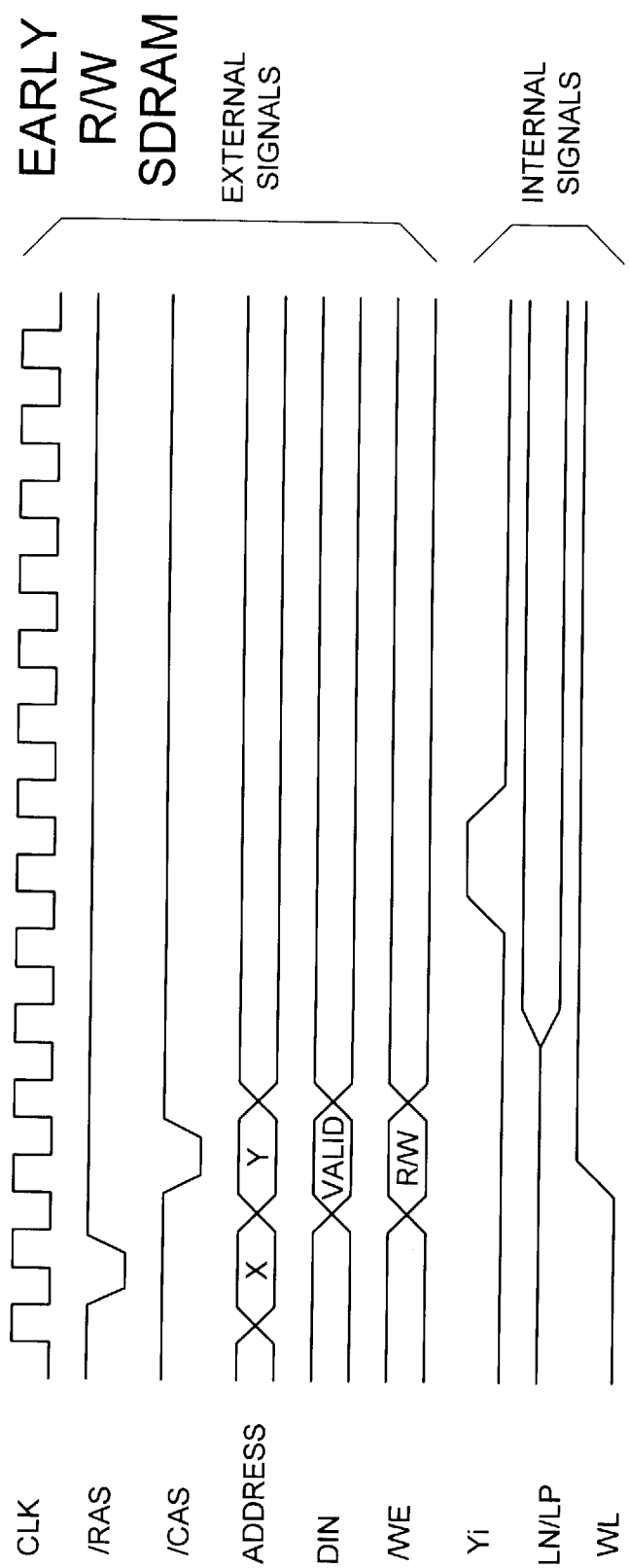
FIG. 6 is a simplified timing diagram for an early read/write SDRAM in accordance with the technique of the present invention illustrating the resulting capability for earlier assertion of the /CAS signal in a synchronous device.

With reference additionally now to FIG. 6, a simplified timing diagram for an early read/write SDRAM in accordance with the technique of the present invention is shown illustrating the capability for earlier assertion of the /CAS signal in a synchronous device. As can be seen, since the column select signals ($Y_{Ri}$ or $Y_{Wi}$) are delayed until either the respective pre-decoded column address signal (CA210R or CA210W) or the corresponding column clock signal (PHIYBR or PHIYBW) is valid, whichever is later, the /CAS signal may be asserted much sooner than in corresponding conventional synchronous DRAM devices illustrated in the timing diagram of FIG. 2.

While there have been described above the principles of the present invention in conjunction with specific circuits and functional implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for effectuating an access operation in a synchronous dynamic random access memory array arranged in rows and columns, said method comprising:

awaiting indication of a valid state of a pre-decoded column address signal for said access operation;

also awaiting indication of a valid state of a column clock signal for said access operation; and delaying a column select signal for said access operation until the later of said valid state of said pre-decoded column address signal or said column clock signal.

2. The method of claim 1 further comprising:

awaiting an indication of a valid state of an array select signal for said access operation;

further awaiting assertion of a clock signal; and delaying said indication of a valid state of said column clock signal until the later of said valid state of said array select signal or said clock signal.

3. The method of claim 2 further comprising:

detecting a sense amplifier enable signal to said memory array; and indicating said valid state of said array select signal upon detection of said sense amplifier enable signal.

4. The method of claim 3 wherein said access operation in a "write" operation.

5. The method of claim 2 further comprising:

detecting a sense amplifier enable signal to said memory array; and indicating said valid state of said array select signal a predetermined time period following detection of said sense amplifier enable signal.

6. The method of claim 5 wherein said access operation is a "read" operation.

7. An integrated circuit device including a circuit for controlling a column select signal in a synchronous dynamic random access memory array, said circuit comprising:

an array select circuit for receiving a sense amplifier enable signal and providing a first array select signal in response thereto;

a first column clock circuit for receiving said first array select signal, a first column address signal and a clock signal, said first column clock circuit providing a first column clock signal in response thereto; and a first access operation column decoder circuit for receiving said first column clock signal and a first pre-decoded column address signal and providing a first column select signal in response thereto.

8. The integrated circuit device of claim 7 wherein said array select circuit further provides a delay signal for input to a main read amplifier of said memory array.

9. The integrated circuit device of claim 7 wherein said first column clock circuit further receives a first select signal input.

10. The integrated circuit device of claim 7 wherein said array select circuit further provides a second array select signal.

11. The integrated circuit device of claim 10 further comprising:

a second column clock circuit for receiving said second array select signal, a second column address signal and said clock signal, said second column clock circuit providing a second column clock signal in response thereto; and a second access operation column decoder circuit for receiving said second column clock signal and a second pre-decoded column address signal and providing a second column select signal in response thereto.

12. The integrated circuit device of claim 7 wherein said array select circuit is operative to delay said first column select signal until the later of an indication of a valid state of said first column clock signal or said first pre-decoded column address signal.

13. The integrated circuit device of claim 12 wherein said first column clock circuit is operative to delay said valid state of said first column clock signal until the later of an indication of a valid state of said first array select signal or an assertion of said clock signal.

14. The integrated circuit device of claim 11 wherein said array select circuit is operative to delay said second column select signal until the later of an indication of a valid state of said second column clock signal or said second pre-decoded column address signal.

15. The integrated circuit device of claim 14 wherein said second column clock circuit is operative to delay said valid state of said second column clock signal until the later of an indication of a valid state of said second array select signal or an assertion of said clock signal.

16. The integrated circuit device of claim 10 wherein said array select circuit is operative to delay said valid state of said second array select signal a predetermined time period following detection of said sense amplifier enable signal.

* * * * *